United States Patent
Yu

(10) Patent No.: US 9,935,297 B2
(45) Date of Patent: Apr. 3, 2018

(54) METHOD FOR MANUFACTURING FLEXIBLE DISPLAY PANEL AND FLEXIBLE DISPLAY PANEL

(71) Applicant: Shenzhen China Star Optoelectronics Technology Co., Ltd., Shenzhen, Guangdong (CN)

(72) Inventor: Wei Yu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 185 days.

(21) Appl. No.: 14/773,427

(22) PCT Filed: Jul. 22, 2015

(86) PCT No.: PCT/CN2015/084815
§ 371 (c)(1),
(2) Date: Sep. 8, 2015

(87) PCT Pub. No.: WO2017/000330
PCT Pub. Date: Jan. 5, 2017

(65) Prior Publication Data
US 2017/0133639 A1    May 11, 2017

(30) Foreign Application Priority Data
Jul. 1, 2015    (CN) .......................... 2015 1 0377037

(51) Int. Cl.
*H01L 21/00* (2006.01)
*H01L 21/30* (2006.01)
(Continued)

(52) U.S. Cl.
CPC .......... *H01L 51/56* (2013.01); *H01L 51/0097* (2013.01); *H01L 51/5237* (2013.01); *H01L 51/5246* (2013.01)

(58) Field of Classification Search
CPC ......... H01L 51/56; H01L 51/00; H01L 51/52; H01L 27/12; H01L 27/32; H01L 21/70
(Continued)

(56) References Cited

U.S. PATENT DOCUMENTS 6,727,970 B2 *  4/2004  Grace ..................... B32B 38/06
                                                        349/155
2001/0040645 A1 * 11/2001 Yamazaki ......... G02F 1/133305
                                                         349/42
(Continued)

*Primary Examiner* — Sheikh Maruf
(74) *Attorney, Agent, or Firm* — Andrew C. Cheng

(57) ABSTRACT

The disclosure provides a method for manufacturing a flexible display panel and a flexible display panel. Wherein the method comprises: binding a flexible substrate with a supporting column matrix on a supporting plate, and fixing the flexible substrate with the supporting plate by a sealant in vacuum, wherein the sealant is disposed at the edge of the supporting column matrix, such that the supporting column matrix is surrounded in a sealed space formed by the sealant, the supporting plate and the flexible substrate; forming a flexible display panel on the flexible substrate; and cutting the supporting plate and the flexible display panel along the inner side of the sealant, such that the flexible display panel separating with the supporting plate. Thus, the flexible substrate can be separated from the supporting plate without damaging devices disposed on the flexible substrate.

6 Claims, 2 Drawing Sheets

— 110

Step 110: binding a flexible substrate with a supporting column matrix on a supporting plate, and fixing the flexible substrate with the supporting plate by a sealant in vacuum, wherein the sealant is disposed at the edge of the supporting column matrix, such that the supporting column matrix is surrounded in a sealed space formed by the sealant, the supporting plate and the flexible substrate.

— 120

Step 120: forming a flexible display panel on the flexible substrate

— 130

Step 130: cutting the supporting plate and the flexible display panel along the inner side of the sealant, such that the flexible display panel separating with the supporting plate.

(51) Int. Cl.
*H01L 21/46* (2006.01)
*H01L 51/56* (2006.01)
*H01L 51/52* (2006.01)
*H01L 51/00* (2006.01)

(58) Field of Classification Search
USPC ........... 438/28, 455, 458, 459; 457/E27.011, 457/E29.295
See application file for complete search history.

(56) References Cited

U.S. PATENT DOCUMENTS

| | | | |
|---|---|---|---|
| 2004/0023591 A1* | 2/2004 | Matsuoka | H01L 51/5259 445/24 |
| 2006/0254704 A1* | 11/2006 | Seo | B32B 37/12 156/249 |
| 2009/0147167 A1* | 6/2009 | Park | G02F 1/134363 349/40 |
| 2010/0202076 A1* | 8/2010 | Liu | G02B 5/201 359/891 |
| 2010/0265440 A1* | 10/2010 | French | G02F 1/133305 349/106 |
| 2010/0279576 A1* | 11/2010 | Kim | G02F 1/1303 445/25 |
| 2010/0279578 A1* | 11/2010 | Matsuzaki | H01L 51/5259 445/25 |
| 2011/0192525 A1* | 8/2011 | Kondo | B30B 5/02 156/99 |
| 2012/0217501 A1* | 8/2012 | Takayama | B32B 7/06 257/59 |
| 2013/0072079 A1* | 3/2013 | Tang | G02F 1/133351 445/24 |
| 2015/0091030 A1* | 4/2015 | Lee | H01L 27/3246 257/91 |
| 2016/0111684 A1* | 4/2016 | Savas | H01L 51/5256 257/40 |
| 2016/0154268 A1* | 6/2016 | Yamazaki | H01L 51/5246 349/138 |
| 2017/0084861 A1* | 3/2017 | Yamazaki | G01N 33/497 |

* cited by examiner

METHOD FOR MANUFACTURING FLEXIBLE DISPLAY PANEL AND FLEXIBLE DISPLAY PANEL

TECHNICAL FIELD

The disclosure is related to the field of display, and more particularly to a method for manufacturing a flexible display panel and a flexible display panel.

RELATED ART

At present, organic light-emitting diode (OLED) displays have become novel panel displays, and are widely used in different display products, such as mobile phones and televisions. Since OLED displays are self-luminous, additional backlight modules are not necessary. Thus, OLED displays can be flexible.

Since flexible substrates are flexible, in the present process of manufacturing OLED flexible panels, the flexible substrates have to be attached to supporting plates by sealants, and then further processes are performed on the flexible substrates; after the processes are performed on the flexible substrates, the flexible substrates are separated from the supporting plates so as to obtain the flexible OLED panels.

However, since the flexible substrates are completely attached to the supporting plates, the flexible substrates may be bent during the stripping process, such that the devices on the flexible OLED panels are damaged and the devices fail.

SUMMARY

The disclosure provides a method for manufacturing a flexible display panel and a flexible display panel, such that the flexible substrate can be separated from the supporting plate without damaging devices disposed on the flexible substrate.

According to the first aspect of the disclosure, a method for manufacturing a flexible display panel is provided. The method comprises: binding a flexible substrate with a supporting column matrix on a supporting plate, and fixing the flexible substrate with the supporting plate by a sealant in vacuum, wherein the sealant is disposed at the edge of the supporting column matrix, such that the supporting column matrix is surrounded in a sealed space formed by the sealant, the supporting plate and the flexible substrate; forming a flexible display panel on the flexible substrate; and cutting the supporting plate and the flexible display panel along the inner side of the sealant, such that the flexible display panel separating with the supporting plate.

Wherein, before the step of binding a flexible substrate with a supporting column matrix on a supporting plate, and fixing the flexible substrate with the supporting plate by a sealant in vacuum, the method further comprises: forming a thin film on the supporting plate; exposing the film, developing the film, baking the film and etching the film, alternatively, exposing the film, developing the film and baking the film, and obtaining the supporting column matrix formed by the thin film; and coating the sealant at the edge of the supporting plate.

Wherein the material of the thin film is silicon nitride SiNx, black matrix BM or photo spacer PS.

Wherein before the step of binding a flexible substrate with a supporting column matrix on a supporting plate, and fixing the flexible substrate with the supporting plate by a sealant in vacuum, the method further comprises: coating a photoresist on a surface of the supporting plate; exposing the surface of the supporting plate, developing the surface of the supporting plate and etching surface of the supporting plate, and obtaining the supporting column matrix formed by the supporting plate; and coating the sealant at the etched region of the edge of the supporting plate.

Wherein the height of the sealant coated at the supporting plate is higher than or equal to the height of the supporting column matrix.

Wherein the sealant is an UV sealant, and the step of fixing the flexible substrate with the supporting plate by a sealant comprises: curing the sealant between the flexible substrate and the supporting plate by an ultraviolet.

Wherein the step of forming a flexible display panel on the flexible substrate comprises: manufacturing an OLED on the surface of the flexible substrate, and packaging the OLED device so as to obtain the flexible display panel.

Wherein the step of cutting the supporting plate and the flexible display panel along the inner side of the sealant, such that the flexible display panel separating with the supporting plate comprises: cutting the supporting plate along the inner side of the sealant, such that the flexible display panel separating with the supporting plate; and cutting the sealant disposed at the edge of the flexible display panel.

Wherein the supporting plate is a glass substrate and/or the flexible substrate is a plastic substrate.

According to the second aspect of the disclosure, a method for manufacturing a flexible display panel is provided. The method comprises: forming a thin film on a supporting plate, exposing the film, developing the film, baking the film and etching the film, alternatively, exposing the film, developing the film and baking the film, and obtaining a supporting column matrix formed by the thin film; alternatively, coating a photoresist on a surface of the supporting plate, exposing the surface of the supporting plate, developing the surface of the supporting plate and etching surface of the supporting plate, and obtaining a supporting column matrix formed by the supporting plate; coating a sealant at the edge of the supporting plate, wherein the sealant is an ultraviolet sealant; binding a flexible substrate with the supporting column matrix on the supporting plate, curing the sealant between the flexible substrate and the supporting plate by an ultraviolet in vacuum, wherein the sealant is disposed at the edge of the supporting column matrix, such that the supporting column matrix is surrounded in a sealed space formed by the sealant, the supporting plate and the flexible substrate; forming a flexible display panel on the flexible substrate; and cutting the supporting plate and the flexible display panel along the inner side of the sealant, such that the flexible display panel separating with the supporting plate.

Wherein the material of the thin film is silicon nitride SiNx, black matrix BM or photo spacer PS.

Wherein the height of the sealant coated at the supporting plate is higher than or equal to the height of the supporting column matrix.

Wherein the step of forming a flexible display panel on the flexible substrate comprises: manufacturing an OLED on the surface of the flexible substrate, and packaging the OLED device so as to obtain the flexible display panel.

Wherein the step of cutting the supporting plate and the flexible display panel along the inner side of the sealant, such that the flexible display panel separating with the supporting plate comprises: cutting the supporting plate along the inner side of the sealant, such that the flexible display panel separating with the supporting plate; and cutting the sealant disposed at the edge of the flexible display panel.

Wherein the supporting plate is a glass substrate and/or the flexible substrate is a plastic substrate.

According to the third aspect of the disclosure, a flexible display panel is provided. Wherein the flexible display panel is manufacture by the method described above.

According to the embodiments of the disclosure, a supporting column matrix is disposed on the supporting plate for supporting the flexible substrate, the flexible panel is bound on the supporting column matrix, as well as the flexible substrates is fixed on the supporting plate by the sealant, such that a vacuum layer is formed between the flexible substrate and the supporting plater. Since the vacuum layer has a strong attractive force, the flexible substrate and the supporting plate can be tightly fixed, such that the flexible substrate would not protrude during the manufacturing process. In addition, after forming the flexible display panel on the flexible substrate, the flexible display panel and the supporting plate are cut along the inner side of the sealant, and the flexible display panel would be separated automatically without damaging the devices disposed on the flexible display panels.

BRIEF DESCRIPTION OF THE DRAWINGS

In order to more clearly illustrate the embodiments of the disclosure, the accompanying drawings for illustrating the technical solutions and the technical solutions of the disclosure are briefly described as below.

DETAILED DESCRIPTION

The following description with reference to the accompanying drawings is provided to clearly and completely explain the exemplary embodiments of the disclosure. It is apparent that the following embodiments are merely some embodiments of the disclosure rather than all embodiments of the disclosure. According to the embodiments in the disclosure, all the other embodiments attainable by those skilled in the art without creative endeavor belong to the protection scope of the disclosure.

Figure 1:
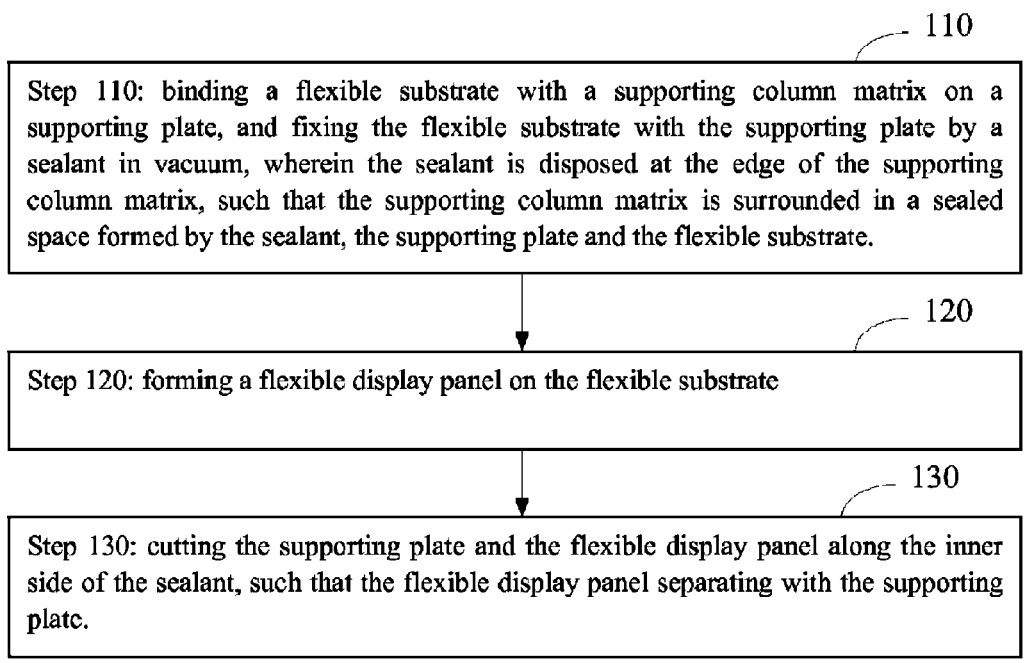
FIG. 1 is a flow chart of the method for manufacturing a flexible display panel according to an embodiment the disclosure.
Figure 2:
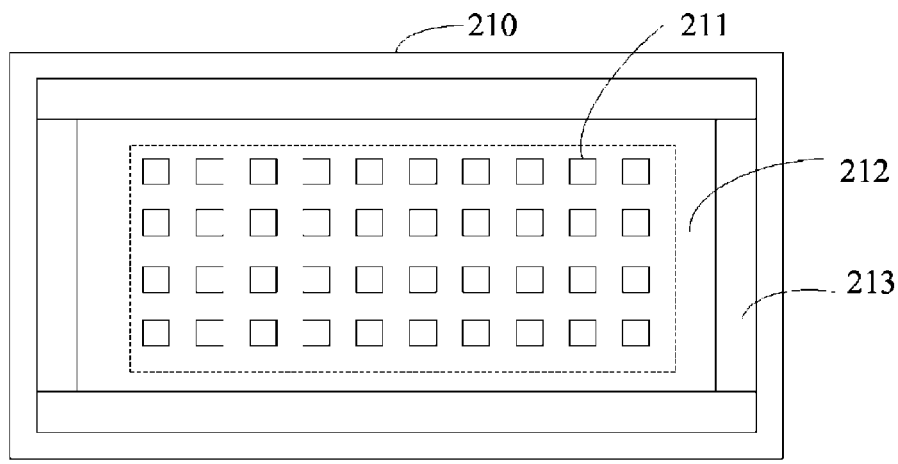
FIG. 2 is a top view of the supporting plate in Step 110 in FIG. 1.
Figure 3:
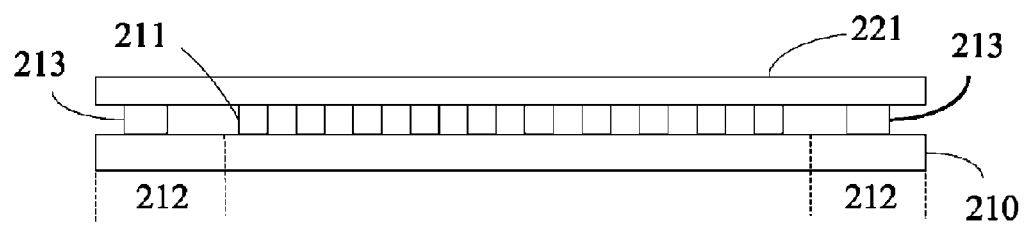
FIG. 3 is a side view of the supporting plate and the flexible substrate in Step 110 in FIG. 1.
Figure 4:
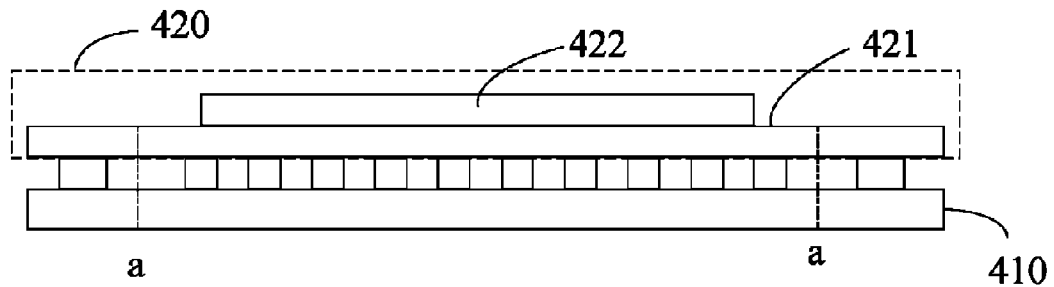
FIG. 4 is a side view of the supporting plate and the flexible display panel in Step 120 in FIG. 1.

Referring to FIG. 1-4, FIG. 1 is a flow chart of the method for manufacturing a flexible display panel according to an embodiment the disclosure, FIG. 2 is a top view of the supporting plate in Step 110 in FIG. 1, FIG. 3 is a side view of the supporting plate and the flexible substrate in Step 110 in FIG. 1, and FIG. 4 is a side view of the supporting plate and the flexible display panel in Step 120 in FIG. 1. According to the embodiments of the disclosure, the flexible display panel is obtained by disposing a display device on the flexible substrate. Wherein, the display device can be an OLED device so as to form a flexible OLED display panel. However, the disclosure is not limited thereto. In some other embodiments, the display device can be other types of devices, such as LED devices. The method for manufacturing a flexible display panel comprises:

Step 110: binding a flexible substrate with a supporting column matrix on a supporting plate, and fixing the flexible substrate with the supporting plate by a sealant in vacuum, wherein the sealant is disposed at the edge of the supporting column matrix, such that the supporting column matrix is surrounded in a sealed space formed by the sealant, the supporting plate and the flexible substrate.

Since the flexible substrate can be easily bent, when disposing the display device on the flexible substrate, the flexible substrate is firstly fixed on a supporting plate, such that the process of disposing the display device can be performed on the flexible substrate.

As shown in FIGS. 2 and 3, in this embodiment, a supporting column matrix is disposed on a surface of the supporting plate 210, such that a supporting force can be provided to the flexible substrate 221. The supporting column matrix is composed of a plurality of supporting columns 211 disposed with intervals therebetween. Wherein, the cross section of the supporting column can be a square, a circle or other shapes, and the disclosure is not limited thereto. In addition, supporting columns are not disposed at the edge 212 of the supporting plate, which is configured for disposing a sealant 213. The width of the edge can be 10-50 mm, and preferably 20 mm.

In this embodiment, the supporting column matrix of the supporting plate having the structure described above is bound with the flexible substrate, and the flexible substrate is fixed with the supporting plate by the sealant in vacuum. Wherein, the sealant is disposed at the edge of the supporting column matrix, i.e. the edge of the supporting plate, such that the supporting column matrix is surrounded in a sealed space formed by the sealant, the supporting plate and the flexible substrate. Thus, the flexible substrate can be firmly fixed by the vacuum region, which is at the edge, between the sealant and the supporting plate.

Optionally, the sealant can be an ultraviolet (UV) sealant. The step of fixing the flexible substrate with the supporting plate by a sealant comprises: curing the sealant between the flexible substrate and the supporting plate by an ultraviolet.

Optionally, the flexible substrate can be a plastic substrates formed by polyethylene naphthalate (PEN) or polyethylene terephthalate (PET). The material of the supporting plate can be any rigid materials, such as a glass plate.

Step 120: forming a flexible display panel on the flexible substrate.

As shown in FIG. 4, after the flexible substrate 421 is fixed on the supporting plate 410, the flexible substrate can be supported by the supporting column matrix, such that it can avoid from being bent when bearing force. A process of manufacturing a display device 422, such as an OLED device, can be performed on the flexible substrate 421. The OLED device is packaged, such that the flexible display panel 420 is formed.

Step 130: cutting the supporting plate and the flexible display panel along the inner side of the sealant, such that the flexible display panel separating with the supporting plate.

In this embodiment, the supporting plate and the flexible display panel, which are fixed by the sealant, are cut along the inner side (the dashed line a in FIG. 4) of the sealant. Since the sealant is cut, the supporting plate and the flexible display panel are not fixed with each other anymore, as well the vacuum region between the supporting plate and the flexible display panel is destroyed. Thus, the flexible substrate would be separated automatically, and stripping processes are not needed.

Wherein, the supporting plate and the flexible display panel can be cut along the inner side of the sealant at the same time, or they can be cut respectively. For example, the supporting plate is cut along the inner side of the sealant, such that the flexible display panel is separated; the sealant at the edge of the flexible display panel is cut.

In the above described embodiments, the supporting column matrix on the supporting plate can be preformed or formed when manufacturing the flexible display panel. Wherein, the supporting column matrix can be obtained by an additional thin film or by performing an etching process or a yellow light manufacturing process to the supporting plate.

According to another embodiment, before Step 110 in the method for manufacturing a flexible display panel, the method further comprises:

forming a thin film on the supporting plate;

exposing the film, developing the film, baking the film and etching the film, alternatively, exposing the film, developing the film and baking the film, and obtaining the supporting column matrix formed by the thin film; and coating the sealant at the edge of the supporting plate.

Wherein the material of the thin film is silicon nitride (SiNx), black matrix (BM) or photo spacer (PS).

According to another embodiment, before Step 110 in the method for manufacturing a flexible display panel, the method further comprises:

coating a photoresist on a surface of the supporting plate;

exposing the surface of the supporting plate, developing the surface of the supporting plate and etching surface of the supporting plate, and obtaining the supporting column matrix formed by the supporting plate; and coating the sealant at the etched region of the edge of the supporting plate.

It can be realized that in the above embodiments the height of the sealant coated at the supporting plate is higher than or equal to the height of the supporting column matrix. Thus, it can be ensured that a sealed space can be formed by the supporting plate, the flexible substrate and the sealant after the supporting column matrix binding with the flexible substrate.

In some other embodiment, the sealant is not coated on the supporting plate. The sealant is coated at the edge of the flexible substrate. Then, the flexible substrate coated with the sealant is bound with the supporting column matrix of the supporting plater and is fixed by the sealant.

According to another embodiment of the disclosure, a flexible display panel is provided. The flexible display panel comprises a flexible substrate and a display device disposed on the flexible substrate, such as an OLED device. Wherein the flexible display panel is manufacture by the method described above.

According to the embodiments of the disclosure, a supporting column matrix is disposed on the supporting plate for supporting the flexible substrate, the flexible panel is bound on the supporting column matrix, as well as the flexible substrates is fixed on the supporting plate by the sealant, such that a vacuum layer is formed between the flexible substrate and the supporting plater. Since the vacuum layer has a strong attractive force, the flexible substrate and the supporting plate can be tightly fixed, such that the flexible substrate would not protrude during the manufacturing process. In addition, after forming the flexible display panel on the flexible substrate, the flexible display panel and the supporting plate are cut along the inner side of the sealant, and the flexible display panel would be separated automatically without damaging the devices disposed on the flexible display panels.

Note that the specifications relating to the above embodiments should be construed as exemplary rather than as limitative of the present disclosure. The equivalent variations and modifications on the structures or the process by reference to the specification and the drawings of the disclosure, or application to the other relevant technology fields directly or indirectly should be construed similarly as falling within the protection scope of the disclosure.

What is claimed is:

1. A method for manufacturing a flexible display panel, comprising the steps of:
    1) providing a supporting plate defining a supporting area and edges surrounding the supporting area;
    2) creating a supporting column matrix over the supporting area of the supporting plate by the following sub-steps of:
        a) forming a thin film over the supporting area;
        b) exposing, developing, baking and etching the supporting area of thin film to create the supporting column matrix;
    3) coating a sealant at the edges of the supporting plate, wherein the sealant is an ultraviolet sealant and is surrounding the supporting column matrix;
    4) binding a flexible substrate onto the supporting plate in a vacuum environment wherein edges of the flexible substrate are in contact with the sealant deployed over the edges of the supporting plate, while a central portion of the flexible substrate is in closely contact and supported by the supporting column matrix by a vacuum created between the flexible substrate and the supporting column matrix;
    5) curing the sealant located between the flexible substrate and the supporting plate by an ultraviolet;
    6) forming a flexible display panel on the flexible substrate; and
    7) separating the supporting plate from the flexible display panel along the inner side of the sealant such that the flexible display panel is separated from the supporting plate.

2. The method according to claim 1, wherein the material of the thin film is selected from silicon nitride (SiNx), black matrix (BM), photo spacer (PS) and photoresist.

3. The method according to claim 1, wherein the height of the sealant coated at the supporting plate is higher than the height of the supporting column matrix.

4. The method according to claim 1, wherein the step 6) of forming a flexible display panel on the flexible substrate comprises:

manufacturing an OLED on the surface of the flexible substrate, and packaging the OLED device so as to obtain the flexible display panel.

5. The method according to claim 1, wherein the step 7) of separating the supporting plate from the flexible display panel along the inner side of the sealant, such that the flexible display panel is separated from the supporting plate, comprises:
    a) cutting the supporting plate along the inner side of the sealant, such that the flexible display panel is separated from the supporting plate; and
    b) cutting the sealant disposed at edges of the flexible display panel.

6. The method according to claim 1, wherein the supporting plate is a glass substrate and the flexible substrate is a plastic substrate.

* * * * *